United States Patent
Zhang et al.

(10) Patent No.: US 9,761,837 B2
(45) Date of Patent: Sep. 12, 2017

(54) METHOD FOR MANUFACTURING OLED DEVICES

(71) Applicant: EverDisplay Optonics (Shanghai) Limited, Shanghai (CN)

(72) Inventors: Liangrui Zhang, Shanghai (TW); Pinghung Chen, Shanghai (TW); Shimin Shen, Shanghai (TW)

(73) Assignee: EVERDISPLAY OPTRONICS (SHANGHAI) LIMITED, Shanghai (CN)

( * ) Notice: Subject to any disclaimer, the term of this patent is extended or adjusted under 35 U.S.C. 154(b) by 0 days.

(21) Appl. No.: 15/143,782

(22) Filed: May 2, 2016

(65) Prior Publication Data

US 2016/0322454 A1    Nov. 3, 2016

Related U.S. Application Data

(60) Provisional application No. 62/154,866, filed on Apr. 30, 2015.

(51) Int. Cl.
*H01L 29/08*    (2006.01)
*H01L 35/24*    (2006.01)
(Continued)

(52) U.S. Cl.
CPC ........ *H01L 51/5256* (2013.01); *H01L 27/323* (2013.01); *H01L 27/3244* (2013.01); *H01L 27/3246* (2013.01); *H01L 27/3262* (2013.01); *H01L 27/3281* (2013.01); *H01L 29/78672* (2013.01); *H01L 51/004* (2013.01); *H01L 51/0035* (2013.01); *H01L 51/0096* (2013.01);
(Continued)

(58) Field of Classification Search
CPC ............ H01L 51/5256; H01L 51/5262; H01L 27/3262; H01L 27/3246; H01L 51/0035; H01L 27/3281; H01L 51/0096; H01L 51/004; H01L 29/78672; H01L 51/5237; H01L 51/524; H01L 51/5253; H01L 27/3244; H01L 27/323
See application file for complete search history.

(56) References Cited

U.S. PATENT DOCUMENTS

2014/0299862 A1* 10/2014 Lee ......................... H01L 27/00
257/40
2015/0014635 A1* 1/2015 Noh ..................... H01L 27/3272
257/40
(Continued)

FOREIGN PATENT DOCUMENTS

| CN | 103325960 | 9/2013 |
|---|---|---|
| CN | 104037360 | 9/2014 |

*Primary Examiner* — Thanh Y Tran
(74) *Attorney, Agent, or Firm* — Andrew F. Young, Esq.; Lackenbach Siegel, LLP

(57) ABSTRACT

The present invention relates to a display technology field, in specifically, to a method for manufacturing an OLED. The organic material film and inorganic material film are formed on the upper surface of the OLED devices, the inorganic material film covers over the organic material film to absorb the stress, and a protective layer is formed on the inorganic material film in prior to the cutting procedure to protect the encapsulated film from scratching and crushing, so that the mechanical strength of the whole OLED devices is increased, the quality of the display is improved.

9 Claims, 4 Drawing Sheets

(51) Int. Cl.
  *H01L 51/00* (2006.01)
  *H01L 51/52* (2006.01)
  *H01L 27/32* (2006.01)
  *H01L 51/56* (2006.01)
  *H01L 29/786* (2006.01)

(52) U.S. Cl.
  CPC ........ *H01L 51/524* (2013.01); *H01L 51/5237* (2013.01); *H01L 51/5253* (2013.01); *H01L 51/5262* (2013.01); *H01L 51/56* (2013.01); H01L 51/0034 (2013.01); H01L 2227/323 (2013.01); H01L 2251/301 (2013.01); H01L 2251/303 (2013.01); H01L 2251/558 (2013.01)

(56) References Cited

U.S. PATENT DOCUMENTS

| | | | |
|---|---|---|---|
| 2015/0144890 A1 | 5/2015 | Ma et al. | |
| 2015/0144909 A1* | 5/2015 | Byun | H01L 51/5253 257/40 |
| 2015/0144930 A1* | 5/2015 | Kim | H01L 51/5256 257/40 |
| 2015/0162565 A1* | 6/2015 | Ryu | H01L 51/5256 257/40 |
| 2016/0064690 A1* | 3/2016 | Kook | H01L 27/3244 257/40 |

* cited by examiner

METHOD FOR MANUFACTURING OLED DEVICES

CROSS-REFERENCE TO RELATED APPLICATIONS

The present application claims priorities to and the benefit of U.S. Provisional Application No. 62/154,866, filed on Apr. 30, 2015, the entire content of which are incorporated herein by reference.

BACKGROUND OF THE INVENTION

1. Field of the Invention

The present invention relates to the display technology field, in specifically, to a method for manufacturing OLED devices.

2. Description of the Related Art

In the recent years, due to the excellent performance, the Organic Light Emitting Diode (OLED) devices which belong to self-luminous devices are widely used as panel display devices. The service life of the OLED device, on the one hand, depends on the selected organic materials, on the other hand, depends on the encapsulation method of the device.

Due to the material property of the OLED device, the OLED device is prone to be metamorphous when being invaded by moisture and oxygen, thus it is prohibited that the oxygen and moisture in the external environment comes into the interior of the device to touch the sensitive organic material and electrode. In the interior of the device, the moisture or the oxygen is prone to cause the property of the OLED device to be degenerated or failed, even a little moisture will strip the organic compound layer from the electrode layer, as a result, generate the black spots will be generated and the service life of the device will be shortened. Therefore, it requires a high standard for OLED to restrain the degeneration and failure in a long course of operation, and to operate steadily with an enough service life. Especially, it is required to implement the service life test to the device, to ensure normal operation of the device in a plurality of years of daily use.

At present, the general encapsulation method is to encapsulate the devices by the cover plate glass with the Frit, as the movement of glass during the falling is limited by the Frit, the stress is concentrated. Therefore, during the test of falling or falling sphere, the broken of the paralleled long edge happens frequently, so that the requirement of the strength of the electric device can not be met. And it is not anticipated by those skilled in the art.

ASPECTS AND SUMMARY OF THE INVENTION

To solve the above-mentioned issues, the invention discloses a method for manufacturing OLED devices, comprising:

a method for manufacturing OLED (Organic Light Emitting Diode) devices, comprising:

providing an array substrate, a surface of the substrate being provided with a plurality of display device unit areas and a cutting area configured to isolate adjacent display device unit areas;

forming a plurality of OLED units, on each portion of the array substrate that is located in the display device unit areas, one of the plurality of OLED units being provided;

manufacturing a first inorganic film to cover surfaces of the plurality of OLED units, and partial surface of the array substrate adjacent to the OLED units, to seal the plurality of OLED units onto the array substrate;

forming an organic film to cover an upper surface of the first inorganic film;

manufacturing a second inorganic film to cover exposed surfaces of the organic film and exposed surfaces of the first inorganic film, and the second inorganic film also covering exposed surfaces of the array substrate;

forming a protection layer on the second inorganic film to cover an upper surface of the second inorganic film;

implementing a cutting procedure at the cutting area to separate the plurality of display device unit areas, to form the OLED devices.

The above method for manufacturing OLED devices, wherein after the cutting procedure, the method further comprises a step of removing the protective layer and a step of forming a polarizer film on the second inorganic film.

The above method for manufacturing OLED devices, wherein after the cutting procedure and before the step of forming a polarizer film, the method further comprises a step of forming a touch layer on the second inorganic film.

The above method for manufacturing OLED devices, further comprises forming a touch layer on the polarizer film.

The above method for manufacturing OLED devices, wherein the first inorganic film and the second inorganic film are formed by chemical vapor deposition (CVD) or atomic layer deposition (ALD).

The above method for manufacturing OLED devices, wherein the organic film is formed by ink-jet print, evaporation or CVD.

The above method for manufacturing OLED devices, wherein the protection layer is a polarizer film or an optically clear adhesive layer.

The above method for manufacturing OLED devices, wherein the protection layer comprises a polarizer film and a touch layer;

the touch layer is formed on the polarizer film, or between the second inorganic film and the polarizer film.

The above method for manufacturing OLED devices, wherein the protection layer is formed and attached onto the second inorganic film by optically clear adhesive or static.

The above method for manufacturing OLED devices, wherein the cutting procedure is laser cut or wheel cut.

The invention has the following advantages or beneficial effects.

The invention discloses a method for manufacturing OLED devices. The organic material film and inorganic material film are formed on the upper surfaces of the OLED units, the inorganic material film covers the organic material film to absorb the stress, and a protective layer is formed on the inorganic material film in prior to the cutting procedure to protect the encapsulated film from scratching and crushing, so that the mechanical strength of the whole OLED is increased, the quality of the display is improved.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
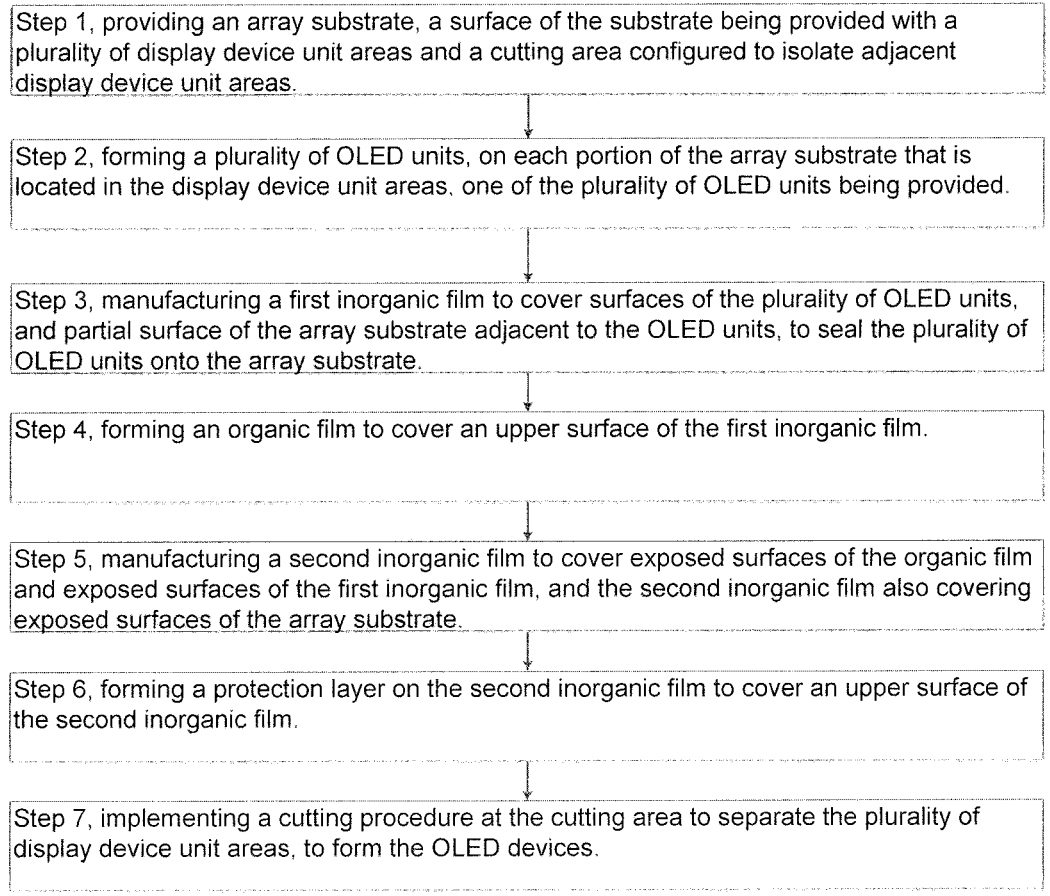
FIG. 1 shows a flow chart of the method for manufacturing OLED devices in an embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

The invention relates to a method for manufacturing OLED devices, the method comprises the steps of:

providing an array substrate, a surface of the substrate being provided with a plurality of display device unit areas and a cutting area configured to isolate adjacent display device unit areas;

forming a plurality of OLED units, on each portion of the array substrate that is located in the display device unit areas, one of the plurality of OLED units being provided;

manufacturing a first inorganic film to cover surfaces of the plurality of OLED units, and partial surface of the array substrate adjacent to the OLED units, to seal the plurality of OLED units onto the array substrate;

forming an organic film to cover an upper surface of the first inorganic film;

manufacturing a second inorganic film to cover exposed surfaces of the organic film and exposed surfaces of the first inorganic film, and the second inorganic film also covering exposed surfaces of the array substrate;

forming a protection layer on the second inorganic film to cover an upper surface of the second inorganic film;

implementing a cutting procedure at the cutting area to separate the plurality of display device unit areas.

The following description further illustrates the method for manufacturing OLED devices.

Figure 2:
FIGS. 2 to 8 shows structure schematic diagrams of the method for manufacturing OLED devices in an embodiment of the present invention.
Figure 11:
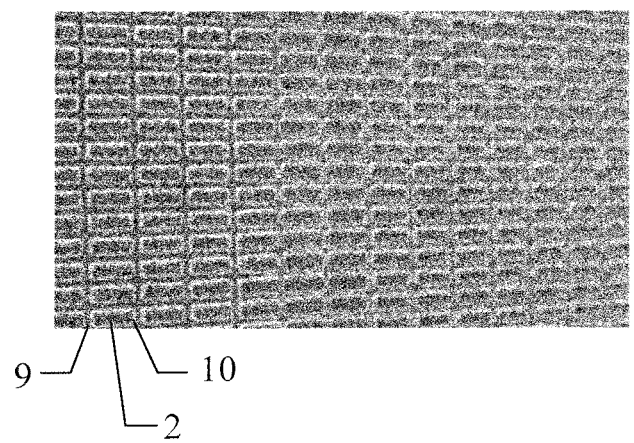
FIG. 11 shows a structure schematic diagram of arrangement of cutting areas and display device unit areas in an embodiment of the present application.

Referring to FIGS. 1 and 11, the embodiment discloses a method for manufacturing OLED devices, which comprises the steps of:

Step 1, providing an array substrate 1, at the surface of which a plurality of display device unit areas 10 and a cutting area 9 used for isolating the adjacent display device unit area 10 are formed, preferably, the array substrate is made of Low Temperature Poly Silicon (LTPS) shown as structure of FIG. 2.

Figure 3:
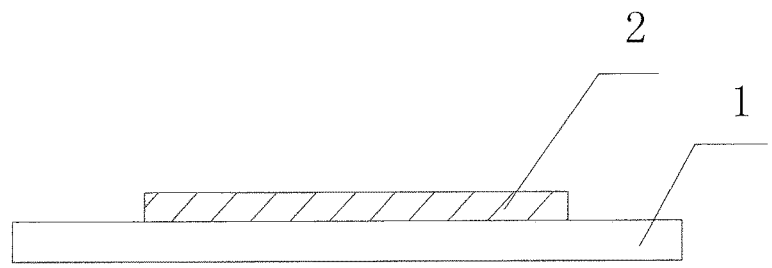

Step 2, forming a plurality of OLED units 2, on each portion of the array substrate 1 that is located in the display device unit areas 10, one of the plurality of OLED units 2 being provided as shown as the structure of FIG. 3.

Figure 4:
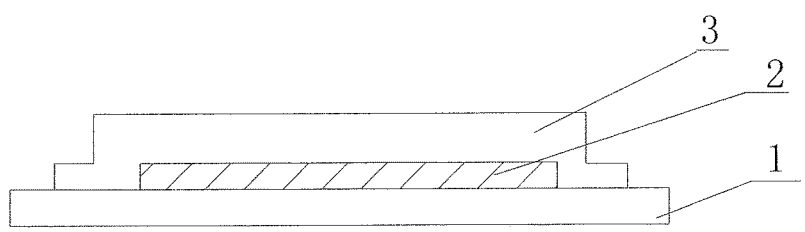

Step 3, manufacturing a first inorganic film 3 to cover surfaces of the plurality of OLED units 2, and partial surface of the array substrate 1 adjacent to the OLED units 2, to seal the plurality of OLED units 2 onto the array substrate 11 (that is, the first inorganic film 3 covers the upper surface and side walls of the OLED units 2, and, together with the array of the substrates 1, covers over the plurality of OLED units 2), the material of the first inorganic film 3 can be a metallic oxide such as $AlO_3$; in a preferred embodiment, the first inorganic film 3 can be formed by the method of chemical vapor deposition (CVD) or atomic layer deposition (ALD), preferably, the first inorganic film 3 can be deposited on the substrates 1 by plasma enhanced chemical vapor deposition (PECVD); in the embodiment, the thickness of the first inorganic film 3 is about 10 nm or greater than 10 nm, as referred to the structure of FIG. 4.

Figure 5:
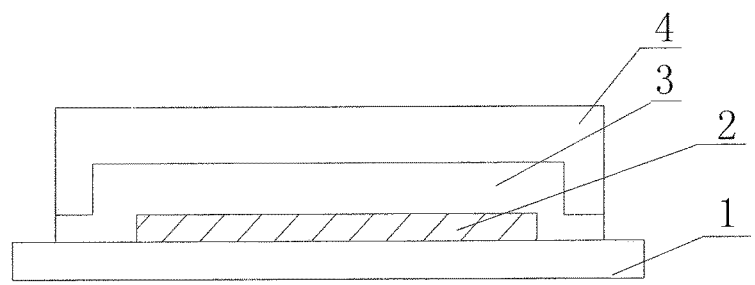

Step 4, forming an organic film 4, to cover the upper surface of the first inorganic film 3; the organic film 4 partially covers the exposed surface of the first inorganic film 3, and the organic film 4 at least covers the upper surface of the first inorganic film 3 which is right above the OLED unit 2; the organic film 4 can be polymer, in a preferred embodiment, the organic film 4 can be formed by ink jet print, evaporation or CVD; the thickness of the organic film 4 is about 5000 nm or greater than 5000 nm, as referred to the structure of FIG. 5.

Figure 6:
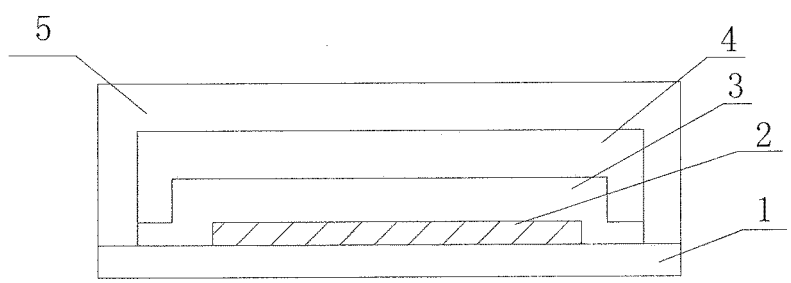

Step 5, manufacturing a second inorganic film 5 to cover exposed surfaces of the organic film 4 and exposed surfaces of the first inorganic film 3, and the second inorganic film 5 also covering exposed surfaces of the array substrate 1; in other words, the second inorganic film 5 covers the exposed surface of the organic film 4, and part of the second inorganic film 5 touches the first inorganic film 3 so that the second inorganic film 5 together with the first inorganic film 3 covers over the organic film 4 completely; the material of the second inorganic film 5 can be a metallic oxide such as AlO3; in a preferred embodiment, the second inorganic film 5 can be formed by chemical vapor deposition (CVD) or atomic layer deposition (ALD), preferred, the second inorganic film 5 can be deposited on the substrates 1 by plasma enhanced chemical vapor deposition (PECVD); in an embodiment of the invention, the material and formation of the second inorganic film 5 can be to the same as or different from those of the first inorganic film 3. In an embodiment of the invention, the thick of the second inorganic film 5 is about greater than 10 nm; as referred to the structure of FIG. 6.

Figure 7:
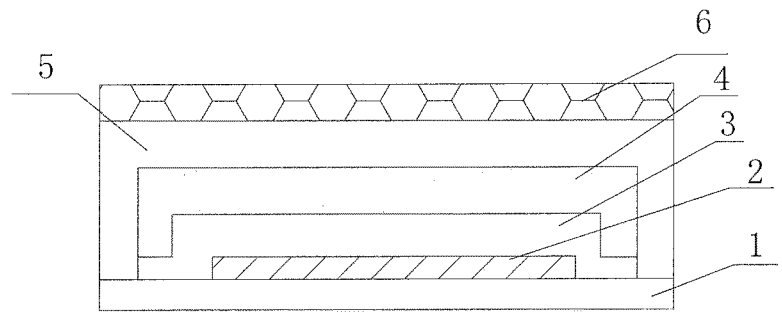

Step 6, forming and laminating the protective layer 6 onto the second inorganic film 5, to cover the upper surface of the second inorganic film 5 which is right above the plurality of OLED units 2, to protect the TFE film (including the first inorganic film 3, the organic film 4 and the second inorganic film 5); specifically, the main material of the protective layer 6 is plastic, as referred to the structure of FIG. 7.

In a preferred embodiment, the protective layer 6 is formed on the second inorganic film 5 by optically clear adhesive. Preferably, the optically clear adhesive is a barrier optically clear adhesive (BOCA) which is oxygen-resistant and moisture-resistant, to prevent the water oxygen from coming into the OLED units 2, to increase the film encapsulation effect.

In a preferred embodiment, the protective layer 6 is a Polarizer film, the manufacturing method for forming which is to laminate polaroid on the whole array of substrates 1 or on a single OLED unit by adhesion or electrostatic adherence. The reason of laminating polaroid in prior to the cutting, is to make the protective film of polaroid prevent the TFE film from scratching and crushing by the glass debris. If there is a requirement for waterproof, the BOCA (a barrier optically clear adhesive which is oxygen-resistant and moisture-resistant) layer instead of polaroid can be used as the protective layer 6. However, the BOCA layer may be damaged by the glass debris.

In a preferred embodiment, the protective layer 6 comprises a Polarizer film and a touch layer (not shown), and the touch layer is formed on the Polarizer film or formed between the second inorganic film 5 and the Polarizer film.

Further, if the touch layer is formed on the Polarizer film, the steps of forming and laminating the protective layer 6 onto the second inorganic film 5 is: firstly, forming a touch layer on the second inorganic film 5, then forming a Polarizer film on the touch layer. If the touch layer is formed between the second inorganic film 5 and the Polarizer film, the steps of forming and laminating the protective layer 6 onto the second inorganic film 5 is: firstly, forming a Polarizer film on the second inorganic film 5, then forming a touch layer on the Polarizer film.

Step 7, implementing a cutting procedure (the cutting procedure can be the laser cut or the wheel cut) at the cutting area 9 to break a plurality of display device unit areas 10. If the protective layer 6 is an entire lamination (that is, the protective layer 6 covers the surface of the cutting area 9), the cutting is applied to the protective layer 6 and the array substrate 1. If the protective layer 6 is single lamination (that is, the protective layer 6 does not cover the surface of the cutting area 9), the cutting is applied to the array substrate 1.

Figure 8:
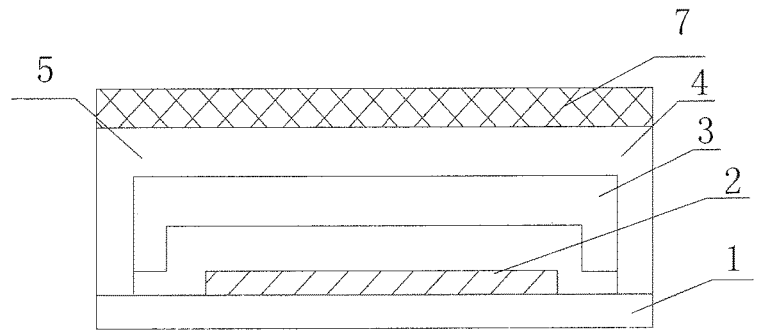

In an alternative embodiment, the method for manufacturing the OLED devices further comprises:

Step 8, removing the protective layer 6, and forming Polarizer film 7 on the second inorganic film 5. In an embodiment of the invention, the polaroid is laminated onto the upper surface of the second inorganic film 5 to form a Polarizer film 7 by optically clear adhesive in a high cleanness environment (class 100-10); as referred to the structure of FIG. 8.

Figure 10:
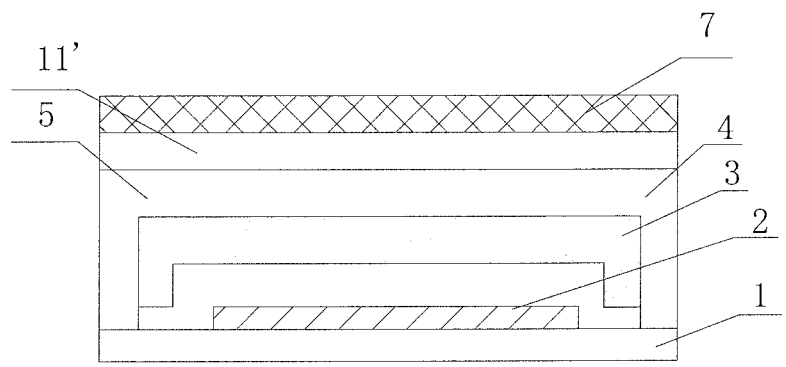
FIG. 10 shows structure schematic diagram of the method for manufacturing OLED devices after a touch layer is formed in another embodiment of the present invention.

As shown in FIG. 10, in a preferred embodiment, the method for manufacturing OLED devices further comprises the step of forming a touch layer 11' on the second inorganic film 5 after the cutting procedure and in prior to the step of forming a Polarizer film 7.

Figure 9:
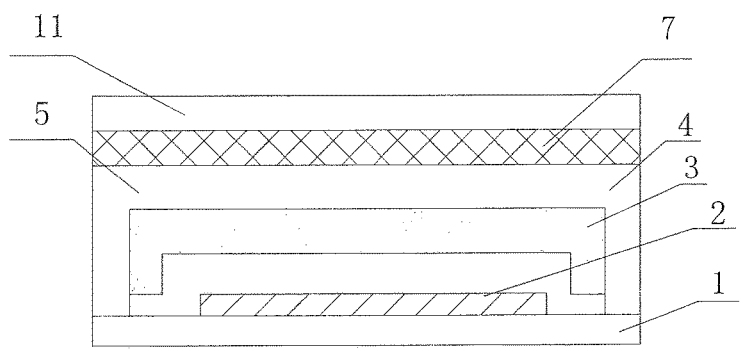
FIG. 9 shows structure schematic diagram of the method for manufacturing OLED devices after a touch layer is formed in an embodiment of the present invention.

As shown in FIG. 9, in a preferred embodiment, the method for manufacturing OLED devices further comprises the step of forming a touch layer 11 on the Polarizer film 7 after forming a Polarizer film 7 on the second inorganic film 5.

Step 9, laminating a chip on film (COF) on the array substrate 1 so as to electrically connect the COF and circuits on the array substrate 1.

The invention discloses a method for manufacturing OLED devices. The organic material film and inorganic material film are formed on the upper surface of the OLED devices, the inorganic material film covers over the organic material film to absorb the stress, and a protective layer is formed on the inorganic material film in prior to the cutting procedure to protect the encapsulated film from scratching and crushing, so that the mechanical strength of the whole OLED devices is increased, the quality of the display is improved.

Those skilled in the art should be understood, it is not listed all the amendments by combining the above-mentioned embodiments and the prior art. The amendments do not impact the content of the invention.

The description listed above is basic principle and main characteristic of the invention. It should be understood that the invention is not limited by the above embodiments. The embodiments and the description listed above are only to explain the principle of the invention, and the invention can have various of changes and modifications. Such changes and modifications can be made without departing from the spirit and scope of the present disclosure and are in the scope of the invention. It is therefore intended that such changes and modifications be covered by the appended claims and equivalent.

What is claimed is:

1. A method for manufacturing OLED (Organic Light Emitting Diode) devices, comprising:
   providing an array substrate, a surface of the substrate being provided with a plurality of display device unit areas and a cutting area configured to isolate adjacent display device unit areas;
   forming a plurality of OLED units, on each portion of the array substrate that is located in the display device unit areas, one of the plurality of OLED units being provided;
   manufacturing a first inorganic film to cover surfaces of the plurality of OLED units, and partial surface of the array substrate adjacent to the OLED units, to seal the plurality of OLED units onto the array substrate;
   forming an organic film to cover an upper surface of the first inorganic film;
   manufacturing a second inorganic film to cover exposed surfaces of the organic film and exposed surfaces of the first inorganic film, and the second inorganic film also covering exposed surfaces of the array substrate;
   forming a protective layer on the second inorganic film to cover an upper surface of the second inorganic film;

implementing a cutting procedure at the cutting area to separate the plurality of display device unit areas, to form the OLED devices; and removing the protective layer and forming a polarizer film on the second inorganic film.

2. The method for manufacturing OLED devices as disclosed in claim 1, wherein after the cutting procedure and before the step of forming a polarizer film, the method further comprises a step of forming a touch layer on the second inorganic film.

3. The method for manufacturing OLED devices as disclosed in claim 1, further comprises forming a touch layer on the polarizer film.

4. The method for manufacturing OLED devices as disclosed in claim 1, wherein the first inorganic film and the second inorganic film are formed by chemical vapor deposition (CVD) or atomic layer deposition (ALD).

5. The method for manufacturing OLED devices as disclosed in claim 1, wherein the organic film is formed by ink-jet print, evaporation or CVD.

6. The method for manufacturing OLED devices as disclosed in claim 1, wherein the protection layer is a polarizer film or a layer made of optically clear adhesive.

7. The method for manufacturing OLED devices as disclosed in claim 1, wherein the protection layer comprises a polarizer film and a touch layer;
the touch layer is formed on the polarizer film, or between the second inorganic film and the polarizer film.

8. The method for manufacturing OLED devices as disclosed in claim 1, wherein the protection layer is formed and attached onto the second inorganic film by optically clear adhesive or static.

9. The method for manufacturing OLED devices as disclosed in claim 1, wherein the cutting procedure is laser cut or wheel cut.

* * * * *